United States Patent
Im et al.

(10) Patent No.: US 9,899,558 B2
(45) Date of Patent: Feb. 20, 2018

(54) PHOTOSENSOR AND DISPLAY DEVICE INCLUDING THE SAME

(71) Applicant: SAMSUNG DISPLAY CO., LTD., Yongin-si, Gyeonggi-do (KR)

(72) Inventors: Ki Ju Im, Suwon-si (KR); Min-Sung Kim, Hwaseong-si (KR); Thanh Tien Nguyen, Seoul (KR); Jae Seob Lee, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/152,980

(22) Filed: May 12, 2016

(65) Prior Publication Data

US 2017/0084774 A1    Mar. 23, 2017

(30) Foreign Application Priority Data

Sep. 23, 2015   (KR) .................. 10-2015-0134857

(51) Int. Cl.
| | |
|---|---|
| *H01L 29/10* | (2006.01) |
| *H01L 31/153* | (2006.01) |
| *H01L 27/12* | (2006.01) |
| *H01L 31/0296* | (2006.01) |
| *H01L 31/0232* | (2014.01) |
| *H01L 27/32* | (2006.01) |

(52) U.S. Cl.
CPC ........ *H01L 31/153* (2013.01); *H01L 27/1225* (2013.01); *H01L 31/0296* (2013.01); *H01L 31/02327* (2013.01); *H01L 27/3262* (2013.01)

(58) Field of Classification Search
CPC .......................... H01L 27/1225; H01L 31/153

USPC ........................... 257/43, 432; 438/85
See application file for complete search history.

(56) References Cited

U.S. PATENT DOCUMENTS

| | | | |
|---|---|---|---|
| 4,227,078 A * | 10/1980 | Yamamoto ............. | G02B 6/421 235/473 |
| 6,373,117 B1 * | 4/2002 | Theil ................. | H01L 27/14647 257/444 |
| 7,495,272 B2 * | 2/2009 | Maruyama .......... | H01L 27/1214 257/291 |
| 7,742,041 B2 * | 6/2010 | Lee ..................... | G02F 1/13338 178/18.06 |
| 8,159,585 B2 | 4/2012 | Parks et al. | |
| 2002/0053871 A1 * | 5/2002 | Seo .................... | H01L 51/5012 313/504 |

(Continued)

FOREIGN PATENT DOCUMENTS

| KR | 1020130070892 | 6/2013 |
|---|---|---|
| KR | 1020140106767 | 9/2014 |

*Primary Examiner* — Jami M Valentine
(74) *Attorney, Agent, or Firm* — F. Chau & Associates, LLC

(57) ABSTRACT

A disclosed photosensor includes: a first electrode layer including a reflection part having an inclination surface; a first semiconductor layer positioned on the first electrode layer; a second electrode layer positioned on the first semiconductor layer; and a first dielectric layer and a second dielectric layer sequentially positioned on the second electrode layer, wherein the first dielectric layer and the second dielectric layer have different dielectric constant values. Further, the disclosed display device includes a plurality of pixel areas positioned on a substrate, and a sensor unit formed in at least some pixel areas among the plurality of pixel areas.

18 Claims, 10 Drawing Sheets

(56) References Cited

U.S. PATENT DOCUMENTS

| | | | |
|---|---|---|---|
| 2005/0082968 A1* | 4/2005 | Choi | G09G 3/3225 |
| | | | 313/506 |
| 2005/0242364 A1* | 11/2005 | Moustakas | B82Y 20/00 |
| | | | 257/103 |
| 2008/0157235 A1* | 7/2008 | Rogers | H01L 21/8258 |
| | | | 257/415 |
| 2009/0057564 A1* | 3/2009 | Miyayama | G01T 1/241 |
| | | | 250/370.09 |
| 2015/0171125 A1 | 6/2015 | Jangjian et al. | |
| 2015/0349016 A1* | 12/2015 | Ham | H01L 27/14658 |
| | | | 257/43 |

\* cited by examiner

PHOTOSENSOR AND DISPLAY DEVICE INCLUDING THE SAME

CROSS REFERENCE TO RELATED APPLICATION

This application claims priority under 35 U.S.C. § 119 to Korean Patent Application No. 10-2015-0134857 filed in the Korean Intellectual Property Office on Sep. 23, 2015, the entire contents of which are incorporated by reference herein in their entirety.

TECHNICAL FIELD

The described technology of the present invention relates generally to a photosensor and a display device including the photosensor.

DISCUSSION OF RELATED ART

A photosensor is generally applied to a display device to implement functions such as user reaction detection, ambient light detection, document scanning, and fingerprint scanning. However, even the photosensor being included in the display device, since a conventional photosensor has less photosensing efficiency, the above-described functions are not smoothly performed. Therefore, it is difficult to directly apply the above-described functions to the display device.

SUMMARY

The present disclosure provides a photosensor having excellent photosensing efficiency and a display device including the same.

The present disclosure provides a photosensor including: a first electrode layer including a reflection part having an inclination surface; a first semiconductor layer positioned on the first electrode layer; a second electrode layer positioned on the first semiconductor layer; and a first dielectric layer and a second dielectric layer sequentially positioned on the second electrode layer, wherein the first dielectric layer and the second dielectric layer have different dielectric constant values.

The first dielectric layer has a first dielectric constant value and the second dielectric layer has a second dielectric constant value, and the first dielectric constant value is larger than the second dielectric constant value.

The difference of the first dielectric constant value and the second dielectric constant value may be in the range of 3 to 60.

The first dielectric constant value of the first dielectric layer may be in the range of 10 to 60.

The first dielectric layer may include at least one selected from a group including hafnium oxide ($HfO_2$), yttrium oxide ($Y_2O_3$), strontium oxide (SrO), barium oxide (BaO), titanium oxide (TiO), and combinations thereof.

The second dielectric constant value of the second dielectric layer may be 10 or less.

The second dielectric layer may include at least one selected from a group including silicon dioxide ($SiO_2$), silicon nitride ($Si_3N_4$), and combinations thereof.

The reflection part may include protrusions and depressions.

The second electrode layer may include at least one selected from a group including indium tin oxide (ITO), indium zinc oxide (IZO), and combinations thereof.

The first semiconductor layer may include a hydrogenated amorphous silicon; a polysilicon; and an oxide semiconductor including at least one of the oxides of gallium (Ga), indium (In), zinc (Zn), hafnium (Hf), and tin (Sn).

The present disclosure provides a display device including: a plurality of pixel areas positioned on a substrate; and a sensor unit formed in at least some pixel areas among the plurality of pixel areas, wherein the sensor unit includes the photosensor according to an exemplary embodiment of the present invention. The photosensor including: a first electrode layer including a reflection part having an inclination surface; a first semiconductor layer positioned on the first electrode layer; a second electrode layer positioned on the first semiconductor layer; and a first dielectric layer and a second dielectric layer sequentially positioned on the second electrode layer, wherein the first dielectric layer and the second dielectric layer have different dielectric constant values.

The first dielectric layer has a first dielectric constant value and the second dielectric layer has a second dielectric constant value, and the first dielectric constant value is larger than the second dielectric constant value.

The reflection part may include protrusions and depressions.

The plurality of pixel areas may respectively include a light emission part and a thin film transistor electrically connected to the light emission part, and the thin film transistor may include a second semiconductor layer and a source electrode and a drain electrode positioned on the second semiconductor layer, partially overlapping the second semiconductor layer, and separated from each other.

The second semiconductor layer may be an oxide semiconductor layer including at least one of the oxides of gallium (Ga), indium (In), zinc (Zn), hafnium (Hf), and tin (Sn).

The second semiconductor layer may include indium-gallium-zinc oxide, and the first semiconductor layer may include the hydrogenated amorphous silicon.

The source electrode and the drain electrode may be positioned at the same layer as the first electrode layer.

The photosensor may be a compensation sensor.

The photosensor may be a touch sensor.

The photosensor according to an exemplary embodiment of the present invention may remarkably improve photosensing efficiency.

Also, since the photosensor according to the present disclosure may function as a compensation sensor, when applying the photosensor to a display device, luminance uniformity of the display device may be obtained.

On the other hand, since the photosensor according to the present disclosure may function as the touch sensor, when applying the photosensor to the display device, a display device having an excellent touch sensing function may be realized while having a thin thickness and excellent display quality.

BRIEF DESCRIPTION OF THE DRAWINGS

Exemplary embodiments of the present invention may best be understood from the following detailed description of preferred embodiments, taken in conjunction with the appended drawings, and in which.

Figure 1:
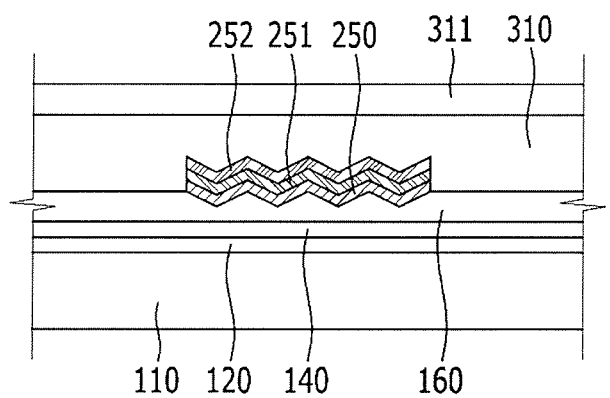
FIG. 1 is a cross-sectional view of a photosensor according to an exemplary embodiment of the present invention.

Since the drawings in FIGS. 1-10 are intended for illustrative purpose, the elements in the drawings are not necessarily drawn to scale. For example, some of the elements may be enlarged or exaggerated for clarity purpose.

DETAILED DESCRIPTION OF THE EMBODIMENTS

The present disclosure will be described more fully hereinafter with reference to the accompanying drawings, in which exemplary embodiments of the present invention are shown. As those skilled in the art would realize, the described exemplary embodiments of the present invention may be modified in various different ways, all without departing from the spirit or scope of the present disclosure.

Throughout the present specification, it will be understood that when an element, for example, a layer, film, region, or substrate is referred to as being "on" another element, it can be directly on the other element or intervening elements may also be present. Further, in the specification, the word "on" means positioning on or below the object portion, but does not necessarily mean positioning on the upper side of the object portion based on a gravity direction.

In addition, unless explicitly described to the contrary, the word "comprise" and variations, for example, "comprises" or "comprising" will be understood to imply the inclusion of stated elements but not the exclusion of any other elements. In addition, the size and thickness of each configuration shown in the drawings are arbitrarily shown for better understanding and ease of description, but the present disclosure is not limited thereto. Further, throughout this specification, parts indicated by the same reference numbers mean the same constituent elements.

FIG. 1 is a cross-sectional view of a photosensor according to an exemplary embodiment of the present invention.

Referring to FIG. 1, a photosensor 201 according to an exemplary embodiment of the present invention includes a first electrode layer 250, a first semiconductor layer 251, a second electrode layer 252, a first dielectric layer 310, and a second dielectric layer 311.

Firstly, the first electrode layer 250 is positioned on a substrate 110. In this case, the substrate 110 may be formed of a hard material such as glass, metal, or PVC, however it may be formed of a flexible material such as polyimide (PI), polyethylene terephthalate (PET), polyether sulfone (PES), polyacrylate (PAR), polyetherimide (PEI), polyethylene naphthalate (PEN), polyethylene terephthalate (PET), polyphenylene sulfide (PPS), polyarylate (PA), or triacetyl cellulose (TAC), however it is not limited thereto. That is, in the present disclosure, the substrate 110 is not limited by various physical properties such as a kind, a property, or a material.

A buffer layer 120 serving to prevent penetration of impure elements and to planarize the surface may be positioned on the substrate 110. In this case, the buffer layer 120 may be made of various materials capable of performing the functions, and may be formed of a single layer, or a multilayer structure of a dual layer or more. For example, a silicon nitride (SiNx) layer, a silicon oxide (SiOx) layer, or a silicon oxynitride (SiOxNy) layer may be used as the formation material of the buffer layer 120, but is not limited thereto. However, the buffer layer 120 is not a required configuration, and may be omitted depending on the type of substrate 110 and process condition.

A gate insulating layer 140 is disposed on the buffer layer 120. The gate insulating layer 140 may include at least one of a tetraethyl orthosilicate (TEOS), a silicon nitride, and a silicon oxide, and may be made as a single layer or a multilayer.

An etch stopper 160 including at least one of inorganic material and organic material is positioned on the gate insulating layer 140, and the etch stopper 160 may also be formed as a single layer or a multilayer.

The etch stopper 160 may include protrusions and depressions corresponding to a reflection part of the first electrode layer 250, since the first electrode layer 250 positioned thereon includes the reflection part having an inclination surface on the partial region. In an alternative embodiment, the layer in which the first electrode layer 250 is positioned is not limited to the etch stopper 160. For example, at least one of the buffer layer 120, the gate insulating layer 140, and the etch stopper 160 may be omitted, and in this case, the protrusions and depressions corresponding to the reflection part of the first electrode layer 250 may be formed on the layer in which the first electrode layer 250 is positioned. For example, when the buffer layer 120, the gate insulating layer 140, and the etch stopper 160 are all omitted, the protrusions and depressions corresponding to the reflection part of the first electrode layer 250 may be formed on the substrate 110.

Next, the first electrode layer 250 is positioned on the partial region in which the protrusions and depressions are formed among the etch stopper 160.

The first electrode layer 250 includes the reflection part having the inclination surface, and may include the protrusions and depressions. FIG. 1 shows that the v-shaped geometry is continuously formed with the protrusions and depressions toward the substrate, but is not limited thereto. For example, the protrusions and depressions may include the recessed shape to the side of substrate, in which the various recessed shapes such as a V-shape, a U-shape, a dome-shape, or combinations thereof may be provided, and the shape thereof is not limited thereto.

Next, the first semiconductor layer 251 is positioned on the first electrode layer 250 to overlap the first electrode layer 250. Since the first semiconductor layer 251 is deposited on the first electrode layer 250, the first semiconductor layer 251 may have the same protrusions and depressions as the first electrode layer 250.

The first semiconductor layer 251 may include a hydrogenated amorphous silicon (amorphous silicon is abbreviated as a-Si), a polysilicon, or an oxide semiconductor which includes at least one of the oxides of gallium (Ga), indium (In), zinc (Zn), hafnium (Hf), and tin (Sn), but is not limited thereto.

The second electrode layer 252 is positioned on the first semiconductor layer 251 to overlap the first semiconductor layer 251. The second electrode layer 252 may use a material for forming a transparent electrode, and for example, the material may include at least one selected from indium tin oxide (ITO), indium zinc oxide (IZO), and combinations thereof.

Next, the first dielectric layer 310 and the second dielectric layer 311 having different dielectric constant values are sequentially positioned on the second electrode layer 252. Particularly, it is preferable that the first dielectric layer 310 and the second dielectric layer 311 satisfy Equation 1.

∈1>∈2. [Equation 1]

In the above equation, ∈1 represents the first dielectric constant value of the first dielectric layer, and ∈2 represents the second dielectric constant value of the second dielectric layer.

In this case, the difference of the dielectric constant values of the first dielectric layer 310 and the second dielectric layer 311 may be in the range of 3 to 60, preferably in the range of 5 to 60, and more preferably in the range of 7 to 60. When the difference of the dielectric constant values of the first dielectric layer 310 and the second dielectric layer 311 satisfies the above number range, the angle capable of totally reflecting the light inflowing to the photosensor 201 in the interface of the first dielectric layer 310 and the second dielectric layer 311 may become larger, and consequently the photosensing efficiency of the photosensor 201 may be improved.

In detail, the dielectric constant value of the first dielectric layer 310 may be in the range of 10 to 60. For example, the first dielectric layer 310 may include at least one selected from hafnium oxide ($HfO_2$), yttrium oxide ($Y_2O_3$), strontium oxide (SrO), barium oxide (BaO), titanium oxide (TiO), and combinations thereof, but is not limited thereto. In this case, the dielectric constant value of hafnium oxide ($HfO_2$) is about 20, the dielectric constant value of yttrium oxide ($Y_2O_3$) is about 10, the dielectric constant value of strontium oxide (SrO) is about 15, the dielectric constant value of barium oxide (BaO) is about 30, and the dielectric constant value of the titanium oxide (TiO) is about 60.

The dielectric constant value of the second dielectric layer 311 may be in the range of 10 or less. For example, the second dielectric layer 311 may include at least one selected from silicon dioxide ($SiO_2$), silicon nitride ($Si_3N_4$), and combinations thereof, but is not limited thereto. In this case, the dielectric constant value of silicon dioxide ($SiO_2$) is about 4, and the dielectric constant value of silicon nitride ($Si_3N_4$) is about 7.

According to an exemplary embodiment of the present invention, the photosensor 201 is a device which can convert photo-energy into electrical energy so as to obtain an electrical signal (current or voltage) from a photo-signal, thus it is a semiconductor element having a photo-detection function. The photosensor 201 is based on a principle that the conductivity of the photosensor 201 is modulated depending on the photo-signal as electrons or holes being generated by photon absorption. That is, the current change of the photosensor 201 is depending on the optical generation rate of a carrier, and the photo-signal, that is changed with time, may be converted into the electrical signal based on this characteristic. When the first electrode layer 250 and the second electrode layer 252 are applied with an anode voltage and a cathode voltage, the light energy inflowing to the photosensor 201 is absorbed in the first semiconductor layer 251, which is positioned between the first electrode layer 250 and the second electrode layer 252, to allow the charges to be accumulated, thereby the light signal is converted into the electrical signal.

According to an exemplary embodiment of the present invention, the first dielectric layer 310 and the second dielectric layer 311 having different dielectric constant values are positioned on the first electrode layer 250 and the second electrode layer 252 which include the reflection part having the inclination surface. With the above structure, the total reflection ratio of the light inflowing to the photosensor 201 may become substantially larger, and consequently the photosensing efficiency may then be remarkably improved.

Figure 2:
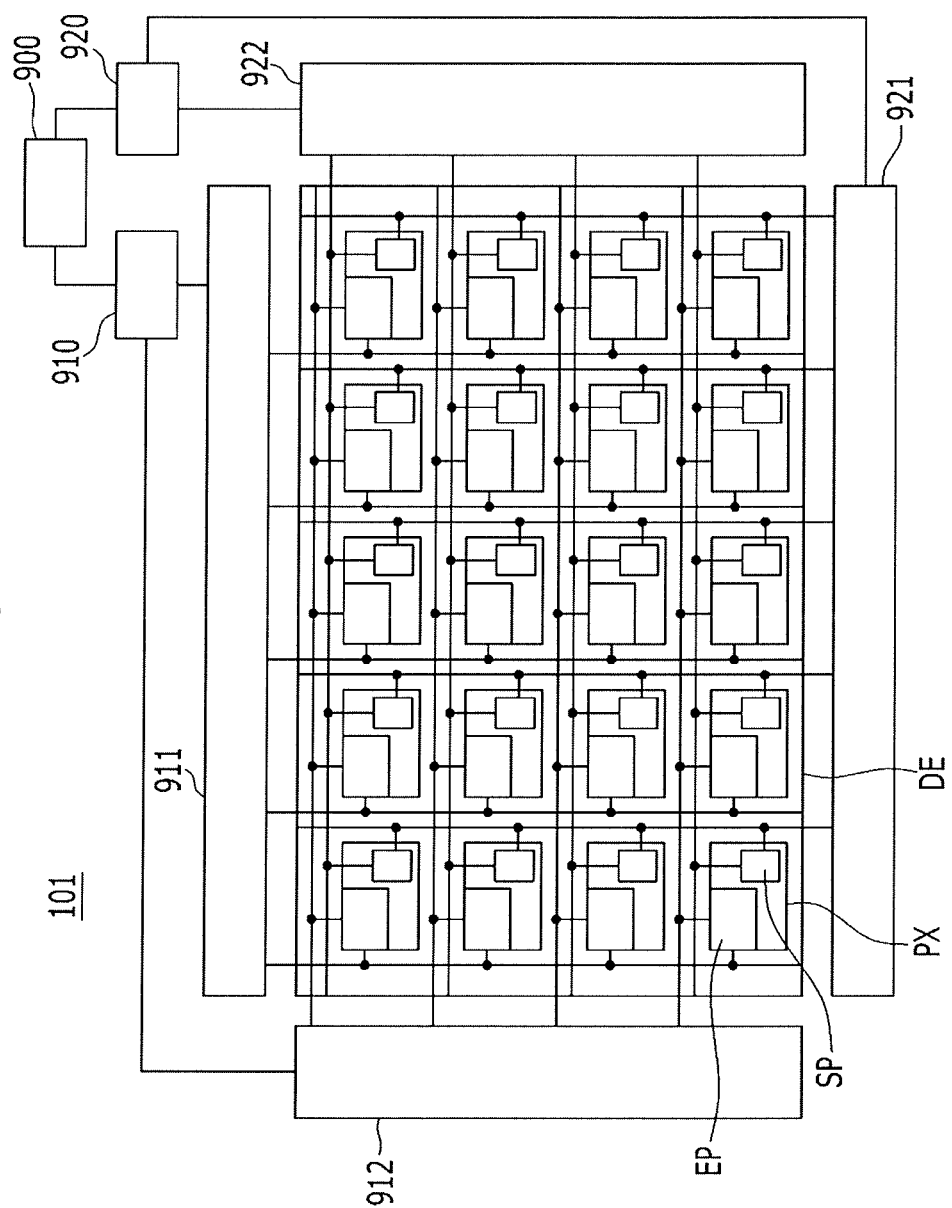
FIG. 2 is a block diagram showing a configuration of a display device according to an exemplary embodiment of the present invention.
Figure 3:
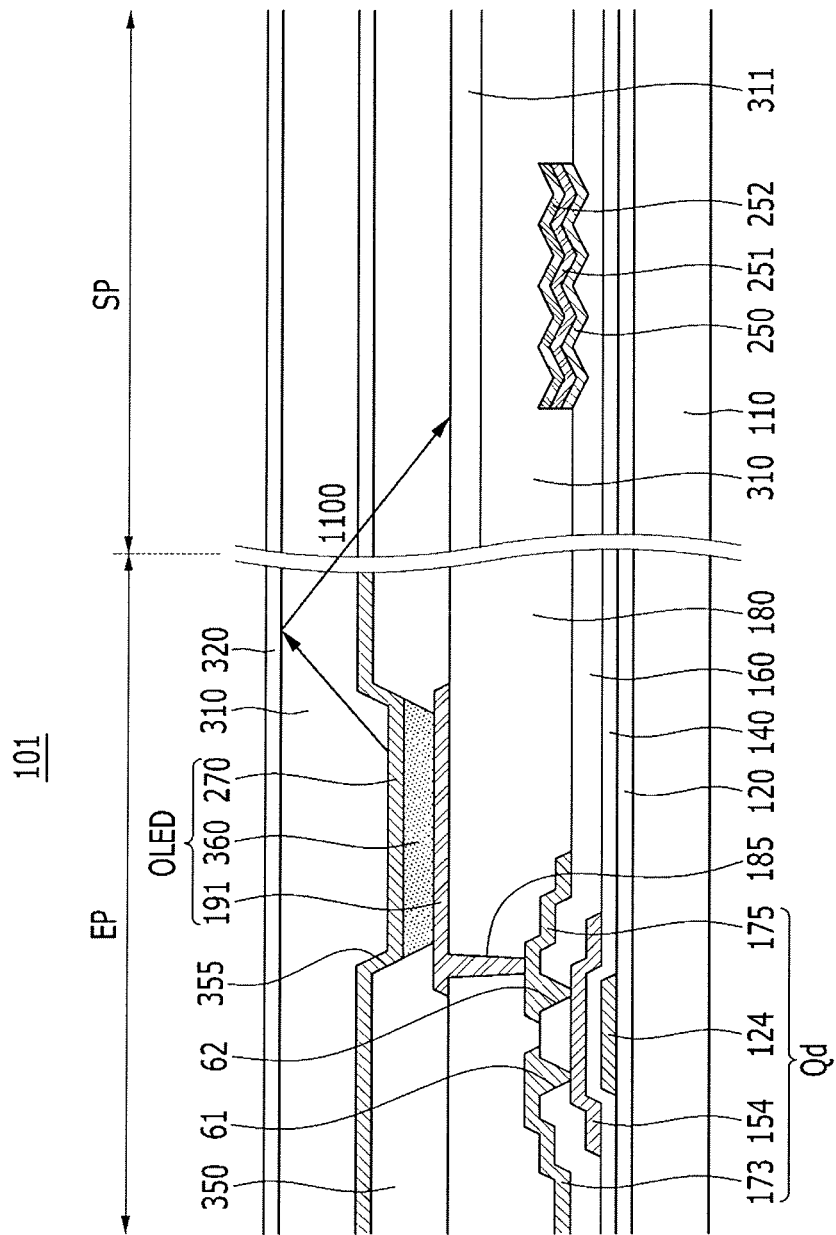
FIG. 3 is a cross-sectional view of a display device according to an exemplary embodiment of the present invention.

FIG. 2 is a block diagram showing a configuration of a display device according to an exemplary embodiment of the present invention, and FIG. 3 is a cross-sectional view of a display device according to an exemplary embodiment of the present invention.

Referring to FIG. 2, a display device 101 according to an exemplary embodiment of the present invention includes a plurality of pixel areas PX formed in a display area DE. In this case, a sensor unit SP is formed in at least some pixel areas PX in the plurality of pixel areas PX, and a light emission part EP is formed in the plurality of pixel areas PX respectively. That is, the light emission part EP may be formed in all the pixel areas PX, while the sensor unit SP may be formed in all the pixel areas PX or may be only formed in some pixel areas PX.

The display device 101 further includes light emission drivers 911 and 912 connected to the light emission part EP to drive the light emission part EP, and sensor drivers 921 and 922 connected to the sensor unit SP to drive the sensor unit SP. Here, the light emission drivers include a first light emission driver 911 supplying a data signal to the light emission part EP and a second light emission driver 912 supplying a gate signal to the light emission part EP. Also, the sensor drivers include a first sensor driver 921 receiving the detection signal from the sensor unit SP and a second sensor driver 922 supplying a reset signal to the sensor unit SP.

The display device 101 further includes a light emitting controller 910 controlling the light emission drivers 911 and 912, a sensor controller 920 controlling the sensor drivers 921 and 922, and a main controller 900 connected to the light emitting controller 910 and the sensor controller 920. In this case, the light emitting controller 910 controls the first light emission driver 911 and the second light emission driver 912, and the sensor controller 920 controls the first sensor driver 921 and the second sensor driver 922. Also, the sensor controller 920 interprets the detection signal transmitted from the first sensor driver 921.

The main controller 900 includes a central processing unit (CPU) for various arithmetic processing, an arithmetic circuit for image processing, and a memory circuit, etc.

The exemplary embodiment of the present invention is not limited to the foregoing. Therefore, the configurations and roles of each driver 911, 912, 921, and 922 and each controller 910, 920, and 900 can be variously modified if necessary.

According to an exemplary embodiment of the present invention, the plurality of pixel areas PX may include the light emission part EP and the sensor unit SP.

The sensor unit SP includes a photosensor 201 as described in the above exemplary embodiment, and the detailed structure of the photosensor 201 is the same as above-described, thus the description thereof is omitted. However, since a pixel definition layer, a common electrode, and an encapsulation layer may be formed on the entire surface of the substrate when manufacturing the display device, they may be sequentially positioned on the second dielectric layer 311 of the sensor unit SP.

Referring to FIG. 3, the display device 101 according to an exemplary embodiment of the present invention includes the substrate 110 and a plurality of thin film structures disposed on the substrate 110.

First, the buffer layer 120 and the gate insulating layer 140 are sequentially positioned on the substrate 110, and these configurations are the same as described in the photosensor 201, thus the description thereof is omitted.

A gate electrode 124 is positioned between the buffer layer 120 and the gate insulating layer 140. Here, the gate electrode 124 may include a metal, for example, gold (Au), silver (Ag), aluminum (Al), nickel (Ni), iron (Fe), or molybdenum (Mo). That is, the gate electrode 124 may be formed of a photo-reflective metal.

A second semiconductor layer 154 is positioned on the gate insulating layer 140. The second semiconductor layer 154 may be the oxide semiconductor layer including at least one of the oxides of gallium (Ga), indium (In), zinc (Zn), hafnium (Hf), and tin (Sn). Particularly, in the present disclosure, the second semiconductor layer 154 may include indium-gallium-zinc oxide (InGaZnO$_4$), and in this case, the first semiconductor layer 251 of the sensor unit SP preferably includes the hydrogenated amorphous silicon. On the other hand, on the second semiconductor layer 154, if necessary, a separate passivation layer may be added to protect the oxide semiconductor that is vulnerable to the external environment such as the exposure to a high temperature.

Next, the etch stopper 160 is positioned on the second semiconductor layer 154 and includes contact holes 61 and 62 through which a source electrode 173 and a drain electrode 175 are respectively contacted. Accordingly, both ends of the region among the etch stopper 160 positioned to overlap the second semiconductor layer 154 may be positioned between the source electrode 173 and the second semiconductor layer 154 and between the drain electrode 175 and the second semiconductor layer 154, but is not limited thereto.

The etch stopper 160 may be simultaneously formed with the contact holes 61 and 62 by using a half-tone mask.

The source electrode 173 and the drain electrode 175 are positioned on both end regions overlapping the second semiconductor layer 154 on the etch stopper 160. Accordingly, the source electrode 173 is connected to one end of the second semiconductor layer 154 through the contact hole 61 and the drain electrode 175 is connected to the other end of the second semiconductor layer 154 through the contact hole 62, so that the source electrode 173 and the drain electrode 175 can be electrically connected to each other. In this case, the source electrode 173 and the drain electrode 175 may be formed as a single layer or a multilayer formed of a low resistance material, for example, Al, Ti, Mo, Cu, Ni, or an alloy thereof, or a corrosion resistant material. For example, the source electrode 173 and the drain electrode 175 may be triple layers of Ti/Cu/Ti or Ti/Ag/Ti. In this case, the source electrode 173 and the drain electrode 175 may be positioned on the same layer as the first electrode layer 250 of the above-described sensor unit SP. The source electrode 173, the drain electrode 175, and the first electrode layer 250, may be simultaneously formed in the same process.

As described above, the gate electrode 124, the second semiconductor layer 154, the source electrode 173, and the drain electrode 175 form a thin film transistor Qd.

A planarization layer 180 is formed on the source electrode 173 and the drain electrode 175. In this case, the planarization layer 180 may be made of one or more materials of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB). On the other hand, the planarization layer 180 may be formed by using the material used for forming the first dielectric layer 310 and/or the second dielectric layer 311 during the process of forming the photosensor 201. Also, the planarization layer 180 may have a smooth surface by removing steps to improve light emission efficiency of the organic light emitting element formed thereon. Further, the planarization layer 180 includes a contact hole 185 exposing the drain electrode 175.

An organic light emitting diode OLED and a pixel definition layer 350 are disposed on the planarization layer 180. In this case, the organic light emitting diode OLED includes a pixel electrode 191, an organic emission layer 360, and a common electrode 270. In an exemplary embodiment of the present invention, the pixel electrode 191 and the common electrode 270 may be formed in plural, and one of the pixel electrode 191 and the common electrode 270 may be the anode electrode functioning as a hole injection electrode, while the other one may be the cathode electrode functioning as an electron injection electrode.

The pixel electrode 191 is disposed on the planarization layer 180 and is physically and electrically connected to the drain electrode 175 of the thin film transistor Qd through the contact hole 185 formed in the planarization layer 180. That is, the pixel electrode 191 receives the electric signal from the drain electrode 175 to transmit electrons or holes to the organic emission layer 360, thereby operating the display device 101 according to the present exemplary embodiment of the present invention. Accordingly, the display device 101 according to an exemplary embodiment of the present invention includes a plurality of pixel electrodes 191 respectively disposed in a plurality of pixels PX. In this case, the plurality of pixel electrodes 191 are disposed to be separated from each other.

Next, on the planarization layer 180, the pixel definition layer 350 formed with an opening 355 of which at least part overlaps the pixel electrode 191 may be positioned. That is, a plurality of openings 355 corresponding each pixel are formed within the pixel definition layers 350, and the opening 355 of the pixel definition layer 350 positioned to overlap at least part of the pixel electrode 191 may define the region of each pixel PX. In this case, the pixel electrode 191 is disposed to correspond to the opening 355 of the pixel definition layer 350. However, the pixel electrode 191 is not always disposed in the opening 355 of the pixel definition layer 350, and as shown in FIG. 3, part of the pixel electrode 191 may be disposed under the pixel definition layer 350 to overlap the pixel definition layer 350.

Since the pixel definition layer 350 is formed on the entire surface of the substrate 110, the pixel definition layer 350 having a predetermined thickness may also be formed on the second dielectric layer 311 of the sensor unit SP.

Next, the organic emission layer 360 may be positioned on the pixel electrode 191, and positioned in the opening 355 of the pixel definition layer 350.

The organic emission layer 360 may be formed of a multilayer including an emission layer, and one or more selected from among an emission layer, a hole-injection layer (HIL), a hole-transporting layer (HTL), an electron-transporting layer (ETL), and an electron-injection layer (EIL). When the organic emission layer 360 includes all of the layers described above, the hole-injection layer is disposed on the pixel electrode 191 as the anode, and the hole-transporting layer, the emission layer, the electron-transporting layer, and the electron-injection layer may be sequentially laminated thereon. The organic emission layer 360 may be made of a low-molecular organic material or a high-molecular organic material such as poly(3,4-ethylenedioxythiophene) (PEDOT).

Next, the organic emission layer 360 may be at least one of a red organic emission layer emitting red light, a blue organic emission layer emitting blue light, and a green organic emission layer emitting green light. In this case, the red organic emission layer, the blue organic emission layer, and the green organic emission layer are formed in the red pixel, the green pixel, and the blue pixel respectively, thereby realizing a color image.

The organic emission layer 360 may be formed by a printing process such as inkjet printing or nozzle printing, or may be formed by using a mask, however it is not limited thereto.

The organic emission layer 360 may also implement color images by stacking the red organic emission layer, the green organic emission layer, and the blue organic emission layer in all of the red pixel, the green pixel, and the blue pixel, and forming a red color filter, a green color filter, and a blue color filter for each pixel.

Next, the common electrode 270 may be positioned on the organic emission layer 360. In this case, since the common electrode 270 is formed on the entire surface of the substrate 110, the common electrode 270 may also be positioned on the pixel definition layer 350 of the sensor unit SP. In this way, the organic light emitting diode OLED including the pixel electrode 191, the organic emission layer 360, and the common electrode 270 is formed. In this case, the pixel electrode 191 and the common electrode 270 may be made of a transparent conductive material, or a transflective or reflective conductive material. Particularly, the reflective conductive material, for example, may be lithium (Li), calcium (Ca), lithium fluoride/calcium (LiF/Ca), lithium fluoride/aluminum (LiF/Al), aluminum (Al), silver (Ag), magnesium (Mg), or gold (Au).

An encapsulation layer 310 may be formed on the common electrode 270. The encapsulation layer 310 encapsulates the organic emission layer 360 and the common electrode 270, thereby preventing external moisture and oxygen from permeating into the encapsulated layers. A top surface of the encapsulation layer 310 may be smooth. The encapsulation layer 310 may include a plurality of thin film layers. For example, the encapsulation layer 310 may have a multi-layered structure including at least one of an organic film and an inorganic film.

Next, a polarization film 320 is disposed on the encapsulation layer 310.

The polarization film 320 serves to change an optical axis of light emitted to the outside through the encapsulation layer 310. In general, a polarizing plate has a structure in which a transparent protection film is deposited on both sides or one side of a polarizer made of polyvinyl alcohol-based resin. However, the polarization film 320 is not limited thereto, and the polarization film made of various structures and materials may be used.

Since the encapsulation layer 310 and the polarization film 320 are also formed on the entire surface of the substrate 110, the encapsulation layer 310 and the polarization film 320 may also be formed on the common electrode 270 of the sensor unit SP.

Hereinafter, to help understanding the present disclosure, an example of the process for manufacturing the display device 101 having the photosensor 201 and having the structure of FIG. 3, will be described with reference to FIG. 4 to FIG. 8.

FIG. 4 to FIG. 8 are views sequentially showing a manufacturing process of a display device according to an exemplary embodiment of the present invention.

Figure 4:
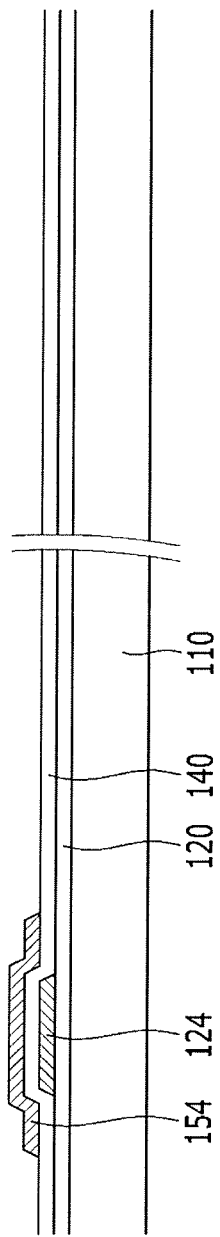
FIG. 4 to FIG. 8 are views sequentially showing a manufacturing process of a display device according to an exemplary embodiment of the present invention.

First, as shown in FIG. 4, the buffer layer 120 is formed on the substrate 110 and the gate electrode 124 is formed thereon. In this case, the buffer layer 120 may be formed by coating the above-described buffer layer formation material through Plasma Enhanced Chemical Vapor Deposition (PECVD), and the gate electrode 124 may be formed by depositing and patterning the above-described metal material by sputtering.

Next, the gate insulating layer 140 is formed on the entire surface of the substrate 110 formed with the gate electrode 124. In this case, the gate insulating layer 140 may be coated by using the above-described material by, for example, PECVD.

Next, the above-described formation material for the second semiconductor layer 154 is coated with the predetermined thickness by Chemical Vapor Deposition (CVD) and is patterned with the predetermined shape, for example, an island shape to form the second semiconductor layer 154.

Figure 5:
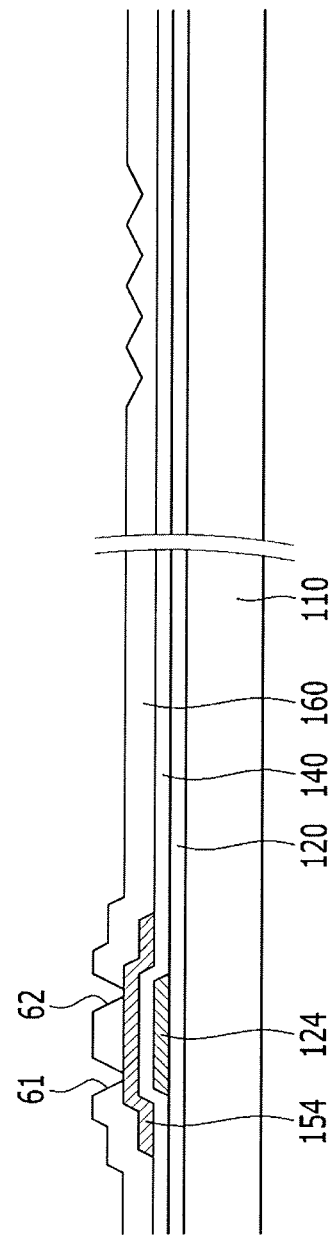

Next, as shown in FIG. 5, the etch stopper 160 is formed. The etch stopper 160 may be formed by coating and patterning at least one of inorganic material and organic material with the predetermined thickness by using, for example, a photolithography process. In this case, the contact holes 61 and 62 of the light emission part EP and the region having the protrusions and depressions for forming the first electrode layer 250 of the sensor unit SP may be simultaneously formed by using the half-tone mask.

Figure 6:
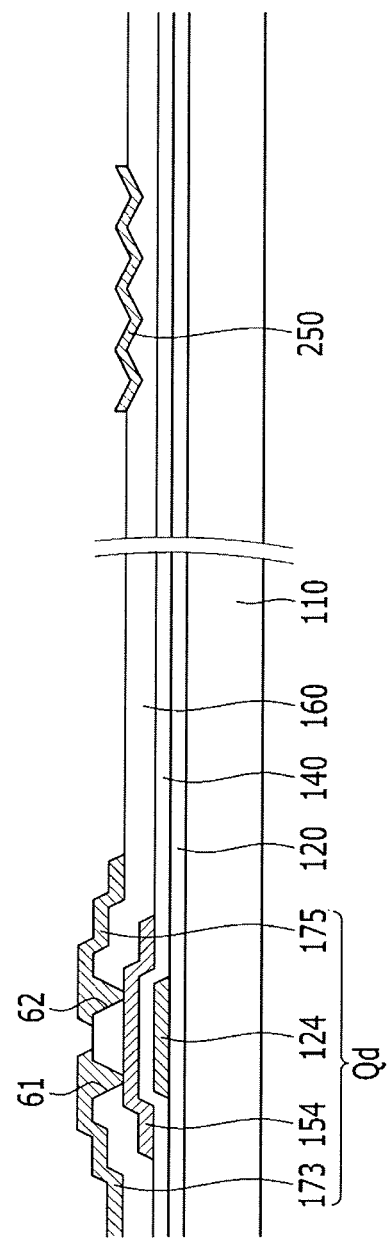

Next, as shown in FIG. 6, the metal layer is deposited by sputtering and is patterned to form the first electrode layer 250 along with the source electrode 173 and the drain electrode 175. Accordingly, the first electrode layer 250 is positioned with the same layer as the source electrode 173 and the drain electrode 175.

Figure 7:
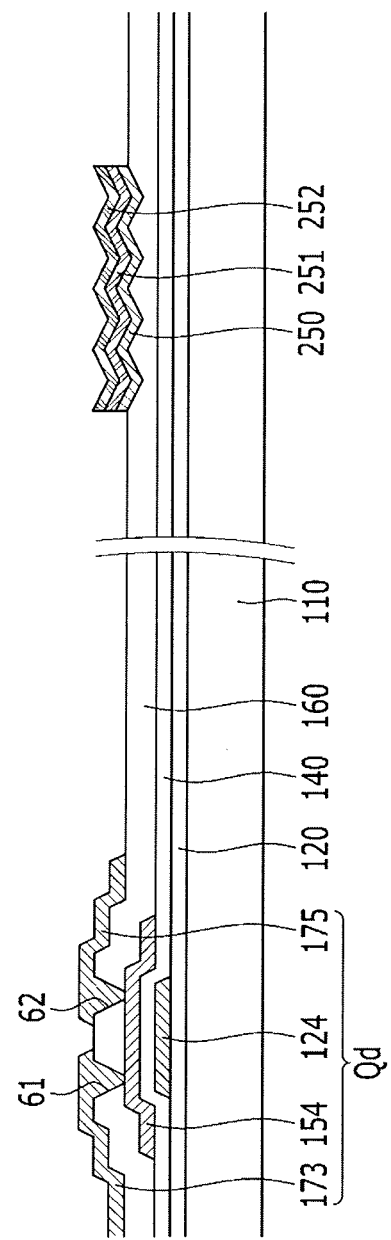

Next, as shown in FIG. 7, the first semiconductor layer 251 and the second electrode layer 252 are sequentially formed on the first electrode layer 250. The first semiconductor layer 251 and the second electrode layer 252 may be formed by using a method that is well known to the corresponding technical field, and for example, a method of depositing and patterning the metal layer by sputtering deposition and lithographic pattering may be performed.

Figure 8:
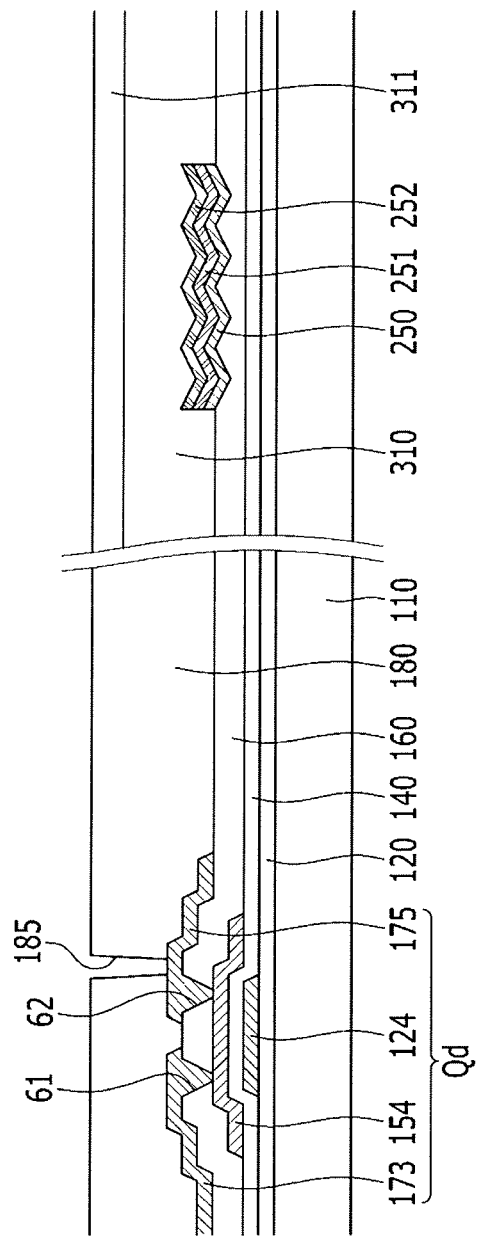

Next, as shown in FIG. 8, the material for forming the first dielectric layer 310 is coated on the sensor unit SP with the predetermined thickness to form the first dielectric layer 310. Also, the same material is coated with the predetermined thickness on the light emission part EP and the sensor unit SP to form the planarization layer 180 in the light emission part EP and the second dielectric layer 311 in the sensor unit SP. In this case, the planarization layer 180 includes the contact hole 185 formed by using the half-tone mask, such that the pixel electrode 191 that is patterned after may be connected with the drain electrode 175.

Next, as shown in FIG. 3, the pixel electrode 191, the pixel definition layer 350, the organic emission layer 360, the common electrode 270, and the encapsulation layer 310 are sequentially formed on the planarization layer 180 to complete the display element layer. In this case, since the pixel definition layer 350, the common electrode 270, and the encapsulation layer 310 are formed on the entire surface of the substrate 110, they may be sequentially positioned on the second dielectric layer 311 of the sensor unit SP.

Next, if the polarization film 320 is adhered to the encapsulation layer 310 by an adhesive, the display device 101 including the photosensor 201 having the structure as shown in FIG. 3 may be manufactured.

According to an exemplary embodiment of the present invention, the photosensor 201 may function as a compensation sensor.

In the described display device 101, the current flowing between the drain electrode and the source electrode of the thin film transistor is controlled by the data signal or the data voltage, thereby controlling the light emitting amount of the organic light emitting element. In this case, when the high driving current flows to the organic light emitting element, degradation of the organic light emitting element is generated such that the luminance of the display device 101 may be non-uniform.

According to an exemplary embodiment of the present invention, the light emitted from the light emission part of each pixel area is transmitted to the photosensor 201 through the total reflection, thereby sensing the luminance of each pixel area. FIG. 3 shows the case that the photosensor 201 according to an exemplary embodiment of the present invention functions as the compensation sensor. That is, if the inner light 1100 emitted in each pixel area is sensed by the photosensor 201 and the luminance deterioration of the partial pixel area is detected, the signal is output to further apply the data voltage to the corresponding pixel area, thereby performing the function of compensating the degradation.

In detail, referring to FIG. 3 as well as FIG. 2, in the display device according to an exemplary embodiment of the present invention, the sensor unit SP converts the irradiated light into the electrical signal which is transmitted to the sensor drivers 921 and 922 by using the photosensor 201 which includes the first electrode layer 250, the first semiconductor layer 251, the second electrode layer 252, the first dielectric layer 310, and the second dielectric layer 311. Next, the sensor controller 920 analyzes the detection signal transmitted to the sensor drivers 921 and 922 to determine whether the application of the data voltage is further required.

The main controller 900 transmits the analog signal to the light emitting controller 910 based on the information analyzed by the sensor controller 920. The light emitting controller 910 converts it into the digital signal which is transmitted to the light emission drivers 911 and 912, and the light emission drivers 911 and 912 transmit the data signal to each light emission part EP. As the light emission part EP further applies the voltage based on the transmitted data signal, the luminance uniformity of the display device 101 may be maintained. That is, since the photosensor 201 according to an exemplary embodiment of the present invention has excellent photosensing efficiency, when the photosensor 201 is applied to the display device 101 as the compensation sensor, the display device 101 having excellent luminance uniformity may be obtained.

According to an exemplary embodiment of the present invention, the photosensor 201 may function as a touch sensor in the display device 101.

When the photosensor 201 functions as a touch sensor, the touch sensing function determines whether a user finger, a pen, etc., touches a screen, and touch position information thereof, by sensing a change of pressure, light, etc., that occurs on a screen in the display device 101 when the user contacts the screen with a finger or a touch pen to write a character or to draw a picture. The display device 101 may receive an image signal based on the contact information.

Generally, in the case of the display device 101 having the touch sensing function, the display device 101 is manufactured by a method of manufacturing a separate touch panel to combine with the display panel. However, when separately manufacturing the touch panel, the entire thickness of the display device 101 may become larger, and the touch panel covers the display panel such that the quality of the image displayed in the display panel may be deteriorated. Accordingly, like the present disclosure, when the photosensor 201 is directly included in the display device 101, the thin thickness may be obtained and the display device 101 having the excellent touch sensing function and the excellent image quality may be simultaneously realized. Also, since the photosensor 201 according to an exemplary embodiment of the present invention has the excellent photosensing efficiency, the accuracy of the contact information may be remarkably improved.

Figure 9:
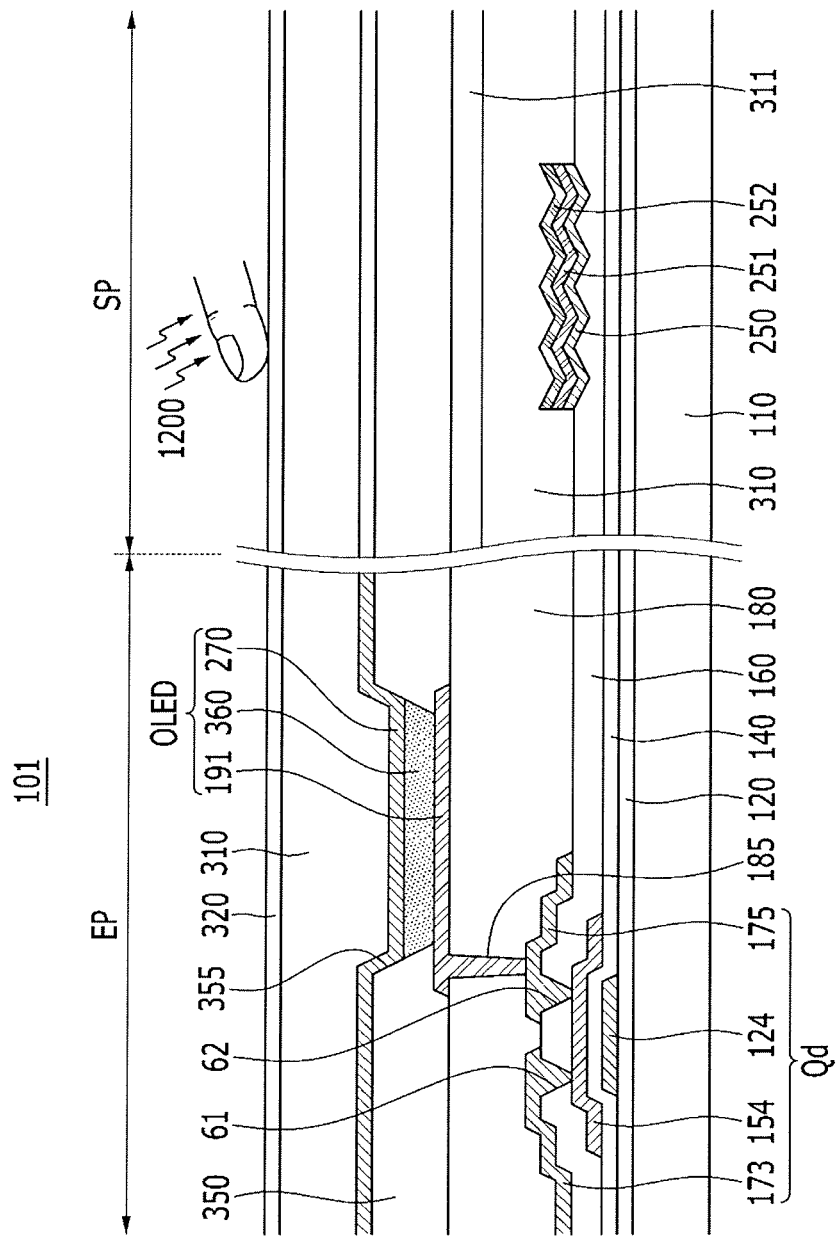
FIG. 9 and FIG. 10 are cross-sectional views of a display device according to another exemplary embodiment of the present invention.
Figure 10:
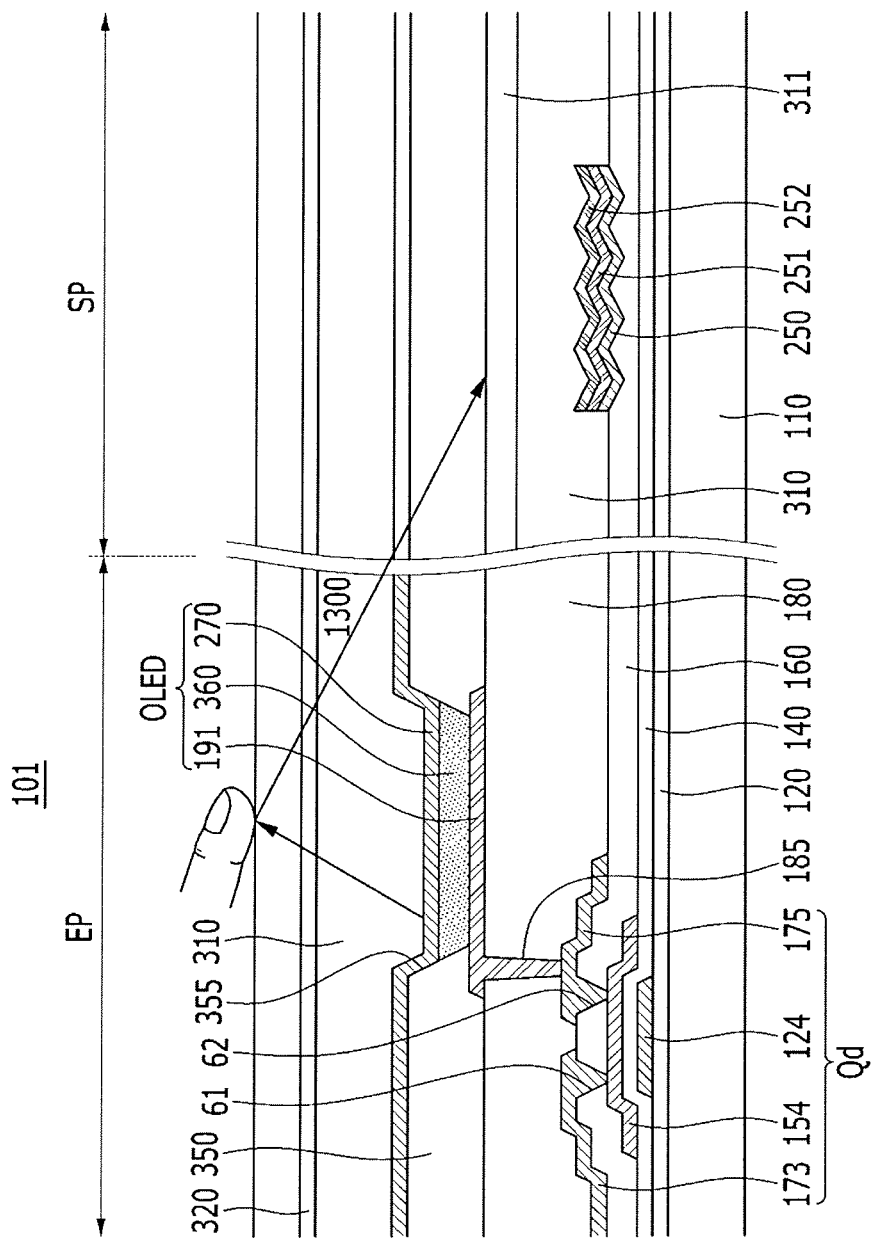

FIG. 9 and FIG. 10 are cross-sectional views of a display device according to another exemplary embodiment of the present invention.

In detail, FIG. 9 is a view to explain sensing position information through the photosensor 201 according to an exemplary embodiment of the present invention in a case of an external photo-environment, and FIG. 10 is a view to explain sensing position information through the photosensor 201 according to an exemplary embodiment of the present invention in a case of an internal photo-environment.

Referring to FIG. 9, in the case of the external photo-environment, if an object such as a finger is close to the display device 101, external light 1200 is not incident onto the portion where the close object is positioned such that the amount of the light flowing to the photosensor 201 is reduced. Also, the amount of the external light 1200 inflowing to the photosensor 201 positioned at the portion where the object is not positioned is relatively large. Accordingly, based on the detection signal generated in the photosensor 201, the contact information such as the contact existence of the object, the contact position, the shape, and the size may be obtained by analyzing the position information where the light amount sensed by the photosensor 201 is relatively small compared with the other positions.

Referring to FIG. 10, in the internal photo-environment, if the object such as a finger is close to the display device 101, internal light 1300 emitted from the light emission part EP is reflected in the portion where the closed object is positioned. Since the reflected light is incident to the photosensor 201, based on the detection signal generated in the photosensor 201, the contact information such as the contact existence of the object, the contact position, the shape, and the size may be obtained by analyzing the position information where the light amount is relatively large compared with the other positions. Accordingly, when the photosensor 201 functions as the touch sensor, the structure of the light emission part EP and the sensor unit SP of the display device 101, and the information input process and the information output process are the same as when it functions as the compensation sensor. However, an algorithm of the main controller 900 may be changed.

Since the photosensor according to an exemplary embodiment of the present invention has the excellent photosensing efficiency, when the photosensor is applied to the display device as the touch sensor, the display device having the excellent touch sensing performance may be obtained.

While this disclosure has been described in connection with what is presently considered to be practical exemplary embodiments, it is to be understood that the disclosure is not limited to the disclosed embodiments. On the contrary, it is intended to cover various modifications and equivalent arrangements included within the spirit and scope of the appended claims.

What is claimed is:
1. A photosensor comprising:
a substrate;
a first electrode layer positioned on the substrate and including a reflection part having an inclination sur- face, the reflection part reflecting light, and the inclination surface being inclined relative to a surface of the substrate;
a first semiconductor layer positioned on the first electrode layer;
a second electrode layer positioned on the first semiconductor layer; and
a first dielectric layer and a second dielectric layer sequentially positioned on the second electrode layer,
wherein the first dielectric layer and the second dielectric layer have different dielectric constant values, and
wherein the first dielectric layer has a first dielectric constant value and the second dielectric layer has a second dielectric constant value, and the first dielectric constant value is greater than the second dielectric constant value.

2. The photosensor of claim 1, wherein
difference of the first dielectric constant value and the second dielectric constant value is in a range of 3 to 60.

3. The photosensor of claim 1, wherein
the first dielectric constant value is in a range of 10 to 60.

4. The photosensor of claim 1, wherein
the first dielectric layer includes at least one selected from the group consisting of hafnium oxide ($HfO_2$), yttrium oxide ($Y_2O_3$), strontium oxide (SrO), barium oxide (BaO), titanium oxide (TiO), and combinations thereof.

5. The photosensor of claim 1, wherein
the second dielectric constant value is 10 or less.

6. The photosensor of claim 1, wherein
the second dielectric layer includes at least one selected from the group consisting of silicon dioxide ($SiO_2$), silicon nitride ($Si_3N_4$), and combinations thereof.

7. The photosensor of claim 1, wherein
the reflection part includes protrusions and depressions.

8. The photosensor of claim 1, wherein
the second electrode layer includes at least one selected from the group consisting of indium tin oxide (ITO), indium zinc oxide (IZO), and combinations thereof.

9. The photosensor of claim 1, wherein
the first semiconductor layer includes at least one selected from the group consisting of a hydrogenated amorphous silicon, a polysilicon, and an oxide semiconductor.

10. The photosensor of claim 9, wherein
the oxide semiconductor includes at least one selected from the group consisting of oxides of gallium (Ga), indium (In), zinc (Zn), hafnium (Hf), and tin (Sn).

11. A display device comprising:
a plurality of pixel areas positioned on a substrate; and
a sensor unit formed in at least some pixel areas among the plurality of pixel areas,
wherein the sensor unit includes a photosensor which comprises:
a first electrode layer positioned on the substrate and including a reflection part having an inclination surface, the reflection part reflecting light, and the inclination surface being inclined relative to a surface of the substrate;
a first semiconductor layer positioned on the first electrode layer;
a second electrode layer positioned on the first semiconductor layer; and
a first dielectric layer and a second dielectric layer sequentially positioned on the second electrode layer,
wherein the first dielectric layer and the second dielectric layer have different dielectric constant values, and
wherein the first dielectric layer has a first dielectric constant value and the second dielectric layer has a second dielectric constant value, and the first dielectric constant value is greater than the second dielectric constant value.

12. The display device of claim 11, wherein
a pixel area of the plurality of pixel areas comprises:
a light emission part; and
a thin film transistor electrically connected to the light emission part,
wherein the thin film transistor comprises:
a second semiconductor layer, and
a source electrode and a drain electrode positioned on the second semiconductor layer, partially overlapping the second semiconductor layer, and separated from each other.

13. The display device of claim 12, wherein
the second semiconductor layer is an oxide semiconductor layer including at least one selected from the group consisting of oxides of gallium (Ga), indium (In), zinc (Zn), hafnium (Hf), and tin (Sn).

14. The display device of claim 13, wherein
the second semiconductor layer comprises indium-gallium-zinc oxide, and
the first semiconductor layer comprises hydrogenated amorphous silicon.

15. The display device of claim 12, wherein
the source electrode and the drain electrode are positioned at the same layer as the first electrode layer.

16. The display device of claim 11, wherein
the photosensor is a compensation sensor.

17. The display device of claim 11, wherein
the photosensor is a touch sensor.

18. The display device of claim 11, wherein
the reflection part includes protrusions and depressions.

* * * * *